United States Patent
Owa

(10) Patent No.: US 9,508,765 B2
(45) Date of Patent: Nov. 29, 2016

(54) PHOTODIODE ARRAY DETECTOR WITH DIFFERENT CHARGE ACCUMULATION TIME FOR EACH LIGHT RECEIVING ELEMENT WITHIN ONE UNIT

(71) Applicant: SHIMADZU CORPORATION, Kyoto-shi, Kyoto (JP)

(72) Inventor: Michiaki Owa, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 122 days.

(21) Appl. No.: 14/474,391

(22) Filed: Sep. 2, 2014

(65) Prior Publication Data

US 2016/0064445 A1    Mar. 3, 2016

(51) Int. Cl.
*H01L 27/146* (2006.01)
*G01J 3/28* (2006.01)

(52) U.S. Cl.
CPC ........ *H01L 27/14601* (2013.01); *G01J 3/2803* (2013.01)

(58) Field of Classification Search
CPC .................. H01L 27/14643; H01L 27/14609; G01J 3/2803; G01N 33/025; G01N 21/359; H04N 5/3692; H04N 5/369

USPC ....................................................... 250/208.1
See application file for complete search history.

(56) References Cited

U.S. PATENT DOCUMENTS

| | | | |
|---|---|---|---|
| 7,489,398 B2* | 2/2009 | Otoi ...................... | G01J 3/2803 356/319 |
| 2015/0296160 A1* | 10/2015 | Tominaga ......... | H01L 27/14609 348/322 |

FOREIGN PATENT DOCUMENTS

JP          08-15013 A       1/1996

* cited by examiner

*Primary Examiner* — Seung C Sohn
(74) *Attorney, Agent, or Firm* — Sughrue Mion, PLLC

(57) ABSTRACT

A photodiode array detector used for detecting light which has undergone wavelength separation by a spectroscopic element, the photodiode array detector including: a light receiving element array wherein, taking a plurality of light receiving elements which detect light of the same wavelength range as one unit, a plurality of such units are arrayed in the direction of dispersion of said wavelength; and a charge accumulation time setting unit which sets different charge accumulation times for the plurality of light receiving elements within the one unit.

3 Claims, 2 Drawing Sheets

PHOTODIODE ARRAY DETECTOR WITH DIFFERENT CHARGE ACCUMULATION TIME FOR EACH LIGHT RECEIVING ELEMENT WITHIN ONE UNIT

TECHNICAL FIELD

The present invention relates to a photodiode array detector. In particular, the invention relates to a photodiode array detector which detects light which has undergone wavelength separation by a spectroscopic element.

BACKGROUND ART

In a spectrophotometer, light emitted from a light source is irradiated onto a sample, and light which has interacted with the sample (transmitted light and the like) undergoes wavelength separation by a spectroscopic element, and the intensity at each wavelength is detected. In such a spectrophotometer, for example, a halogen lamp or deuterium lamp is used as the light source, a diffraction grating is used as the spectroscopic element, and a photodiode array detector is used as the detector.

Figure 1:
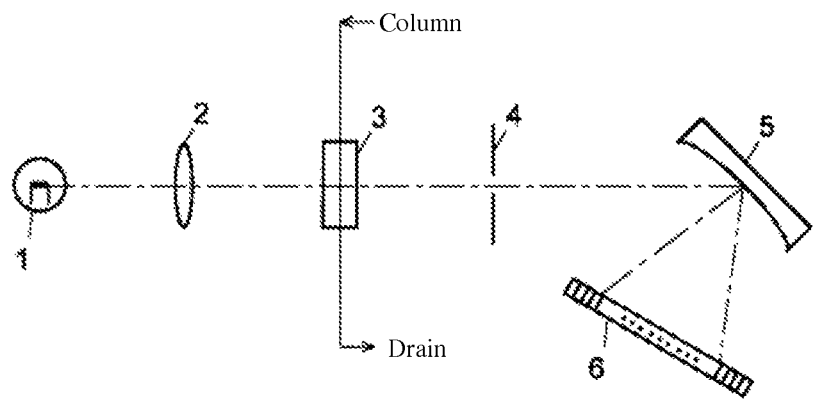

A photodiode array detector of this sort is used for example in the detection section of a liquid chromatograph. The configuration of the major parts thereof is shown in FIG. 1. Light emitted from a light source 1 is condensed by a lens 2 and irradiated onto a sample cell 3. Components in the sample which have been separated chronologically in an unillustrated column flow into the sample cell 3 along with the mobile phase, absorb light of a specified wavelength, and are then ejected into a drain. Light which has been transmitted through the sample cell 3 passes through a slit 4 and then undergoes wavelength dispersion by a concave diffraction grating 5 and is detected by a photodiode array detector 6. The detection signal from the photodiode array detector 6 is used for identifying sample components or determining the concentration of sample components.

Photodiode array detector 6 comprises, for example, 1000 elements lined up in a one-dimensional array, being arranged such that the light of the shortest wavelength enters the first element and light of the longest wavelength enters the $1000^{th}$ element. Light which has entered each light receiving element is converted to an electric charge and accumulated. The electric charge which has been accumulated over a predetermined period of time is extracted to form a detection signal. Since there is an upper limit to the amount of electric charge which can be accumulated in a light receiving element, the charge accumulation time is set such that the electric charge accumulated in a light receiving element will not become saturated.

The intensity of the light radiated from a halogen lamp or deuterium lamp differs depending on wavelength. If the charge accumulation time is set with reference to the wavelength at which the intensity of the light emitted from such light sources (hereinafter referred to as "light intensity of the light source") reaches its maximum, the detection signal in the wavelength region of low light intensity of the light source will be weak and will be buried in noise. Thus, in the prior art, measures have been devised to maintain a high S/N ratio even in the wavelength region of low light intensity by setting the charge accumulation times of the light receiving elements making up the photodiode array detector in accordance with the light intensities of the various wavelength regions (for example, Patent literature 1). Normally, the charge accumulation time of each light receiving element is set to the time at which the charge accumulated in each light receiving element reaches saturation capacity in a state where there is no absorption of light by the sample components (in a state where only the mobile phase is made to flow through the sample cell 3).

PRIOR ART LITERATURES

Patent Literatures (Patent literature 1) Japanese Unexamined Patent Application Publication H8-15013

SUMMARY OF THE INVENTION

Problem to be Solved by the Invention

Even with a spectrophotometer in which a different charge accumulation time is set for each wavelength as described above, in cases where a sample component is at a high concentration, the quantity of light which enters the light receiving elements in the wavelength range in which that sample component absorbs light will be small and the amount of accumulated charge will be small. As a result, the influence of noise will become large and the precision of the value of the detection signal will decline. If the precision of the value of the detection signal is low, the problem will arise that it will not be possible to accurately determine the concentration of the sample component when the concentration of the sample component is to be determined using a calibration curve.

The problem to be solved by the present invention is to provide a photodiode array detector which makes it possible to acquire the value of a detection signal with high precision even in cases where the quantity of light entering a light receiving element is small.

Means for Solving the Problem

The present invention, which was made to resolve the aforementioned problem, is a photodiode array detector used for detecting light which has undergone wavelength separation by a spectroscopic element, said photodiode array detector being characterized in that it includes:

a) a light receiving element array wherein, taking a plurality of light receiving elements which detect light of the same wavelength range as one unit, a plurality of such units are arrayed in the direction of dispersion of said wavelength; and b) a charge accumulation time setting unit which sets different charge accumulation times for the plurality of light receiving elements within said one unit.

In the photodiode array detector according to the present invention, taking a plurality of light receiving elements which detect light of the same wavelength range as one unit, a plurality of such units are arrayed in the direction of wavelength dispersion to form a light receiving element array. The light receiving elements contained in a single unit are arranged adjacent to each other so that they detect light of the same wavelength range. Specifically, the light receiving elements may be lined up in a single row or arranged as a lattice.

For example, if two light receiving elements are taken as one unit, the two light receiving elements may be lined up in the same direction as the wavelength dispersion direction such that the light receiving elements as a whole are arranged as a one-dimensional array, or the two light receiving elements may be lined up in the direction orthogonal to the wavelength dispersion direction such that the light receiving elements as a whole are arranged as a two-dimensional array.

Furthermore, for example, when four light receiving elements are taken as one unit, in addition to the arrangements described above, one unit can be composed of light receiving elements arranged in a 2×2 lattice, with these being lined up in the wavelength dispersion direction to form the light receiving element array.

When arranging the light receiving elements as a one-dimensional array, the wavelength of light detected by each of the plurality of light receiving elements within the unit will be different, but the entire wavelength range detected by the light receiving elements within the unit are treated as the above-mentioned same wavelength range.

In the photodiode array detector according to the present invention, the charge accumulation time of each unit is set separately, taking into account the light intensity of the light source in the wavelength range of light received by that unit. In any of the arrangements of light receiving elements described above, for example, when transmitted light which has passed through a sample is to be measured using this photodiode array detector, the charge accumulation time of the first light receiving element of a given unit is set to a time which it takes for the charge accumulation quantity to become saturated in a state where there is no absorption of light by the sample components (a state where the light is made to pass only through the mobile phase in the sample cell). The charge accumulation time of the second light receiving element of the same unit is set to be longer than the charge accumulation time of the first light receiving element. If a third or subsequent light receiving elements are present, their charge accumulation times are successively set longer.

Using the photodiode array detector according to the present invention, by setting the charge accumulation time of each light receiving element as described above, it is possible to obtain high precision values of the detection signal with the second and subsequent light receiving elements even when the quantity of light entering the light receiving elements is small.

The photodiode array detector according to the present invention preferably comprises, in addition, c) a signal value determination unit which determines if the values of the detection signals obtained from the plurality of light receiving elements within said one unit are within a preset range, and based on the results thereof, determines the value of the detection signal of the one unit.

In this mode, the width of values having suitable precision is preset to the aforementioned range, and the determination of whether the value of the detection signal obtained from each of the light receiving elements contained in a single unit is within that range is made by the signal value determination unit to determine the value of the detection signal of that unit, thereby making it possible for the value of the detection signal of each unit to have suitable precision.

For example, the aforementioned signal value determination unit may treat the detection signals obtained from the light receiving elements contained in each unit as follows. First, a detection signal comparison unit determines if the value of the detection signal obtained from the first light receiving element, for which the shortest charge accumulation time is set within a single unit, is within a preset range (equal to or greater than a preset threshold value and less than the maximum value of the detection signal). The threshold value is set to a value which makes it possible to deem that the influence of noise is small and that the value of the detection signal has high precision. If the value of the detection signal obtained from the first light receiving element is within the aforementioned range, the value of that detection signal is used as the basis for determining the value of the detection signal for light in the wavelength range detected by the unit in question.

On the other hand, if the magnitude of the detection signal obtained from the first light receiving element is smaller than the aforementioned threshold value, the detection signal comparison unit determines if the value of the detection signal obtained from the second light receiving element is within the aforementioned preset range. If this value is within this range, the detection signal determination unit determines the value of the detection signal for light in the wavelength range detected by the unit in question based on the value of the detection signal obtained from the second light receiving element. If a third or subsequent light receiving elements are present, evaluation is repeated with each of them and the value of the detection signal is determined in the same manner as above. However, when the light receiving element set to the longest charge accumulation time within that one unit has been reached as a result of repeating the evaluation, the value of the detection signal of that unit is determined based on the value of the detection signal of that light receiving element. Here, the case was described where evaluation is performed in sequence starting from the light receiving element set to the shortest charge accumulation time within a single unit, but the evaluation may also be conversely performed in sequence starting from the light receiving element set to the longest charge accumulation time within a single unit.

Here, an example of the charge accumulation time setting and detection signal processing was described for a case where transmitted light which has passed through a sample is to be measured using the photodiode array detector according to the present invention; however, when fluorescent light from a sample is to be measured, this can be suitably modified, such as by setting the charge accumulation time of the second light receiving element shorter than the charge accumulation time of the first light receiving element.

Effect of the Invention

In addition to the first light receiving element, the photodiode array detector according to the present invention also uses a signal detected by at least one light receiving element set to a longer charge accumulation time than the first light receiving element. Thus, a detector value with a high precision is obtained from the signals obtained from the plurality of light receiving elements contained within each unit and is taken as the detection signal for the wavelength range detected by that unit. Therefore, the detection signal value can be obtained with high precision

BRIEF DESCRIPTIONS OF THE DRAWINGS

FIG. 1 A diagram of the configuration of the major parts of a spectrophotometer used in the detection section of a liquid chromatograph.

Figure 2:
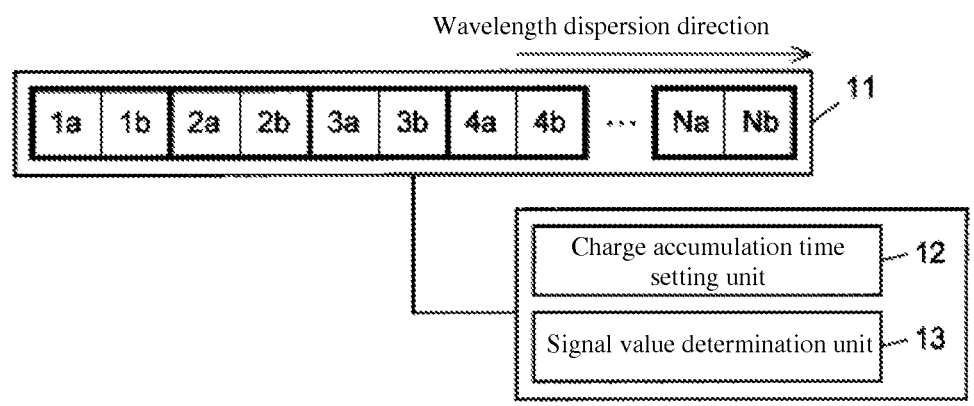

FIG. 2 A diagram illustrating the configuration of a photodiode array detector according to Example of Embodiment 1.

Figure 3:
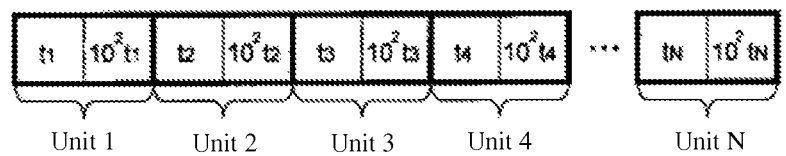

FIG. 3 A diagram illustrating the charge accumulation time of light receiving elements in the photodiode array detector according to Example of Embodiment 1.

Figure 4:
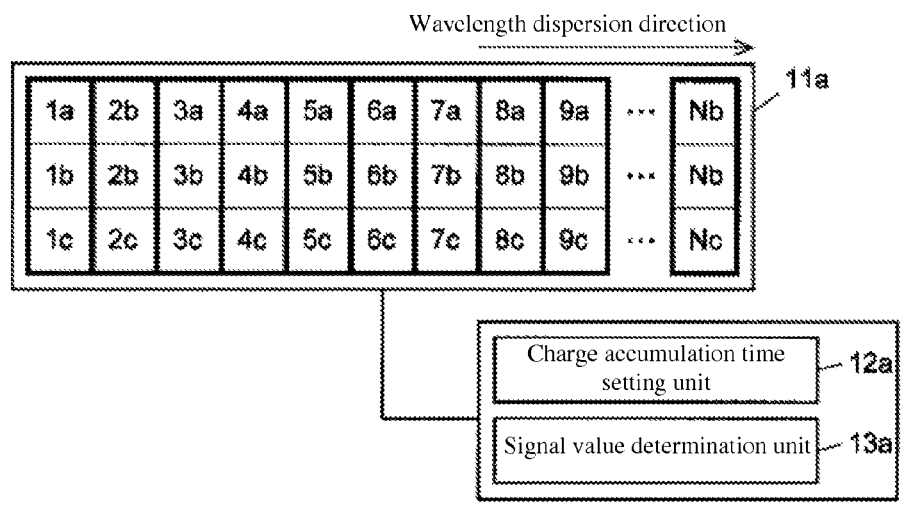

FIG. 4 A diagram illustrating the configuration of a photodiode array detector according to Example of Embodiment 2.

Figure 5:
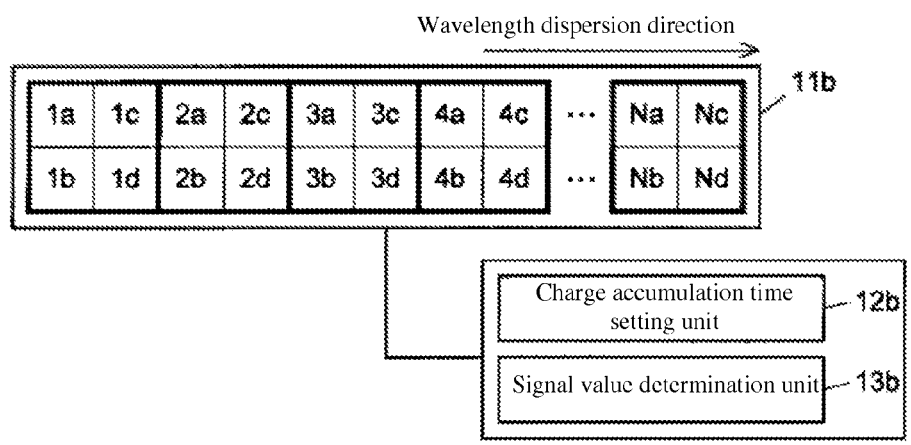

FIG. 5 A diagram illustrating the configuration of a modified example of a photodiode array detector according to the present invention.

DETAILED DESCRIPTION OF THE EXEMPLARY EMBODIMENTS

Examples of embodiment pertaining to the photodiode array detector according to the present invention will be described below with reference to the drawings.
(Example of Embodiment 1)

The photodiode array detector of Example of Embodiment 1 is used in the detection section of a liquid chromatograph (see FIG. 1). The configuration of the essential parts of the photodiode array detector of Example of Embodiment 1 is shown in FIG. 2. This photodiode array detector comprises a light receiving element array 11, charge accumulation time setting unit 12 and signal value determination unit 13. The light receiving element array 11 is configured by lining up 2N light receiving elements in the wavelength dispersion direction of concave diffraction grating 5. In the light receiving element array 11, two adjacent elements constitute one unit, with light receiving elements 1a, 1b (unit 1), light receiving elements 2a, 2b (unit 2), . . . , light receiving elements Na, Nb (unit N) being arranged in sequence. The entire wavelength range detected by the two light receiving elements contained in each unit is treated as a single wavelength range.

The value (upper limit value) of the detected signal obtained in a state where the charge accumulated in the light receiving elements making up the light receiving element array 11 of Example of Embodiment 1 has reached saturation capacity is 1×M, and the lower limit value of the detection signal which makes it possible to ensure the precision required for determining the concentration of a sample component (at which the influence of noise can be deemed to be small) is $10^{-2}$×M. Namely, the ratio between the upper limit value and the lower limit value of detection signals which can be obtained with good precision is 100.

The charge accumulation time set by the charge accumulation time setting unit 12 in each light receiving element is shown in FIG. 3. The charge accumulation times of light receiving elements 1a, 2a, . . . , Na are set to the time (1×$t_1$, 1×$t_2$, . . . , 1×$t_N$) when the charge accumulated in each light receiving element reaches saturation capacity in a state where there is no absorption of light by the sample (in a state where only mobile phase is made to flow through the sample cell 3). Furthermore, the charge accumulation times of light receiving elements 1b, 2b, . . . , Nb are set respectively to $10^2$×$t_1$, $10^2$×$t_2$, . . . , $10^2$×$t_N$. Namely, the charge accumulation times of light receiving elements 1b, 2b, . . . , Nb are set based on the ratio between the upper limit value and lower limit value of detection signals which can be obtained with good precision.

Here, the light receiving elements 1a, 1b, within unit 1 will be described in detail. The ratio between the upper limit value and lower limit value of detection signals which can be obtained with good precision in the light receiving elements of Example of Embodiment 1 is 100, as stated above. Therefore, if the upper limit of light intensity which can be detected by light receiving element 1a is Imax, then light having light intensity of $10^{-2}$×Imax to 1×Imax can be detected with good precision by light receiving element 1a. Furthermore, the value of the detection signal when the intensity of incoming light is 1×Imax and $10^{-2}$×Imax is 1×M and $10^{-2}$M respectively. However, when the light intensity is weaker than $10^{-2}$×Imax, the value of the detection signal will become smaller than $10^{-2}$×M and the influence of noise will increase, so it will not be possible to detect that light with good precision with light receiving element 1a.

The charge accumulation time of light receiving element 1b is set to 100 times the charge accumulation time of light receiving element 1a. Therefore, the detection signal obtained from light receiving element 1b when light intensity is $10^{-2}$×Imax will be 1×M. Furthermore, the lower limit of light intensity which can be detected by light receiving element 1b is $10^{-4}$×Imax, and the detection signal obtained in this case is $10^{-2}$×M. Namely, the range of light intensities which can be detected with good precision by light receiving element 1b is $10^{-4}$×Imax to $10^{-2}$×Imax.

The detection signals obtained from light receiving elements 1a, 1b in unit 1 are processed as follows by signal value determination unit 13. First, it is determined if the value of the detection signal obtained from light receiving element 1a is equal to or greater than $10^{-2}$×M but less than 1×M. If the value of the detection signal obtained from light receiving element 1a is within this range, then this detection signal is used as the basis for determining the value of the detection signal of unit 1. On the other hand, if the value of the signal obtained from light receiving element 1a is smaller than $10^{-2}$×M, then the value of the detection signal for light in the wavelength range detected by the unit in question is determined based on the value of the detection signal obtained from light receiving element 1b.

Only unit 1 was described here, but the same holds for the other units. In photodiode array detectors of conventional configuration, since there is a single light receiving element which detects light in a single wavelength range, the range of light intensities which can be detected with good precision is $10^{-2}$×Imax to 1×Imax, but using the photodiode array detector of Example of Embodiment 1, this can be extended to a range of $10^{-4}$×Imax to 1×Imax.
(Example of Embodiment 2)

Next, the photodiode array detector of Example of Embodiment 2 will be described. Description of components, etc. which are the same as in the photodiode array detector of Example of Embodiment 1 will be omitted, and only those points which differ from Example of Embodiment 1 will be described. The photodiode array detector of Example of Embodiment 2 also comprises a light receiving element array 11a, charge accumulation time setting unit 12a and signal value determination unit 13a.

In Example of Embodiment 2, as shown in FIG. 4, one unit consists of three light receiving elements, which are lined up in a direction perpendicular to the direction of wavelength dispersion to form the light receiving element array 11a. In the photodiode array detector of Example of Embodiment 1, two light receiving elements are lined up in the same direction as the direction of wavelength dispersion to form one unit, so the wavelength resolution decreases in half as compared to a conventional photodiode array detector having one light receiving element that detects light of a single wavelength range. However, with a configuration such as that of Example of Embodiment 2, it is possible to expand the range of light intensities that can be detected with good precision without reducing the wavelength resolution.

In Example of Embodiment 2, the charge accumulation times of the three light receiving elements 1a, 1b, 1c within the unit 1 are set respectively to 1×$t_1$, $10^2$×$t_1$ and $10^4$×$t_1$. The idea of setting the charge accumulation time of each light receiving element within each unit based on the ratio between the upper limit value and the lower limit value of detection signals which can be obtained with good precision is the same as in Example of Embodiment 1.

The treatment of detection signals obtained from the light receiving elements 1a, 1b, 1c within unit 1 by the signal value determination unit 13b is also the same as in Example of Embodiment 1. If the value of the detection signal obtained from light receiving element 1a is $10^{-2} \times M$ or more but less than $1 \times M$, the value of the detection signal of unit 1 is determined based on the detection signal obtained from light receiving element 1a. Otherwise, it is evaluated if the value of the detection signal obtained from light receiving element 1b is within the aforementioned range, and if that value is within the aforementioned range, the value of the detection signal of unit 1 is determined based on the value of the detection signal obtained from light receiving element 1b. If the value of the detection signal obtained from light receiving element 1b is less than $10^{-2} \times M$, then the value of the detection signal of unit 1 is determined based on the value of the detection signal obtained from light receiving element 1c.

The examples of embodiment described above are all just examples and can be modified at one's discretion while abiding by the gist of the present invention. For example, the light receiving elements may be arranged in a 2×2 lattice to form one unit, with the units being lined up in the direction of wavelength dispersion to form the light receiving element array 11b, as shown in FIG. 5. In this example as well, the charge accumulation time of each light receiving element is set by charge accumulation time setting unit 12b, and the value of the detection signal for light of the wavelength range detected by each unit is determined by the signal value determination unit 13b.

In the examples of embodiment described above, the charge accumulation times of the light receiving elements 1b, 2b, . . . , Nb were set based on the ratio of upper limit value and lower limit value of detection signals which can be obtained with good precision in the light receiving element used, but the method of setting the charge accumulation time is not limited to this. Specifically, when the aforementioned ratio is 100, if the ratio of charge accumulation times of light receiving elements 1a, 1b, . . . is set to 100 or less, a detection signal can be reliably obtained with good precision by any of the plurality of light receiving elements contained within one unit. There can be cases where the value of the detection signal obtained from the plurality of light receiving elements within a single unit will be within the aforementioned range if the ratio of charge accumulation times of the light receiving elements 1a, 1b, . . . is set smaller. In such cases, one may determine the value of the detection signal of the given unit by prioritizing larger detection signal values, or determine the value of the detection signal of the unit by averaging.

In the examples of embodiment described above, the case was described where evaluation is performed in sequence starting from the light receiving element set to the shortest charge accumulation time within a single unit, but evaluation may also be conversely performed in sequence starting from the light receiving element set to the longest charge accumulation time within a single unit.

Furthermore, the examples of embodiment described above assume using a photodiode array detector for the detection section of a liquid chromatograph, and taking the charge accumulation time of light receiving element 1a as reference, the charge accumulation times of light receiving elements 1b, 1c were set successively longer. However, for example, when the photodiode array detector according to the present invention is used to measure a light emission spectrum, one may also take the charge accumulation time of light receiving element 1a as reference and set the charge accumulation times of light receiving elements 1b, 1c successively shorter.

EXPLANATION OF REFERENCES

1 . . . Light source
2 . . . Lens
3 . . . Sample cell
4 . . . Slit
5 . . . Concave diffraction grating
6 . . . Photodiode array detector
10 . . . Photodiode array detector
11, 11a, 11b . . . Light receiving element array
12, 12a, 12b . . . Charge accumulation time setting unit
13, 13a, 13b . . . Signal value determination unit

What is claimed:

1. A photodiode array detector used for detecting light which has undergone wavelength separation by a spectroscopic element, said photodiode array detector comprising:
   a) a light receiving element array wherein, taking a plurality of light receiving elements which detect light of the same wavelength range as one unit, a plurality of such units are arrayed in a wavelength dispersion direction; and
   b) a charge accumulation time setting unit which sets a different charge accumulation time for each of the plurality of light receiving elements within said one unit.

2. The photodiode array detector as described in claim 1, further comprising:
   c) a signal value determination unit which determines if the values of the detection signals obtained from the plurality of light receiving elements within said one unit are within a preset range, and based on the results thereof, determines the value of the detection signal for the light of the wavelength range detected by said one unit.

3. The photodiode array detector as described in claim 2, wherein the signal value determination unit determines if a first value of a first detection signal obtained from a first light receiving element of the plurality of light receiving elements within said one unit is within the preset range, determines the value of the detection signal for the light of the wavelength range detected by said one unit based on the first value when the first value is within the preset range, and determines whether a second value of a second light detection signal obtained from a second light receiving element of the plurality of light receiving elements within said one unit is within the preset range when the first value is not within the preset range.

* * * * *